(12) United States Patent
Moyer et al.

(10) Patent No.: US 7,453,756 B2
(45) Date of Patent: *Nov. 18, 2008

(54) METHOD FOR POWERING AN ELECTRONIC DEVICE AND CIRCUIT

(75) Inventors: William C. Moyer, Dripping Springs, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/469,084

(22) Filed: Aug. 31, 2006

(65) Prior Publication Data

US 2008/0056049 A1 Mar. 6, 2008

(51) Int. Cl.
G11C 5/14 (2006.01)
(52) U.S. Cl. .................. 365/226; 365/227; 365/229
(58) Field of Classification Search .............. 365/226, 365/227, 228, 229
See application file for complete search history.

(56) References Cited

U.S. PATENT DOCUMENTS

| | | | |
|---|---|---|---|
| 6,075,742 A | 6/2000 | Youssef et al. | |
| 6,597,620 B1 * | 7/2003 | McMinn | 365/226 |
| 6,744,301 B1 | 6/2004 | Tschanz et al. | |
| 6,925,025 B2 | 8/2005 | Deng et al. | |
| 6,954,397 B2 | 10/2005 | Marshall | |
| 7,020,041 B2 | 3/2006 | Somasekhar et al. | |
| 7,237,132 B2 * | 6/2007 | Lou | 713/323 |
| 2001/0028591 A1 * | 10/2001 | Yamauchi | 365/227 |
| 2003/0025930 A1 * | 2/2003 | Tateyama | 358/1.14 |
| 2003/0061526 A1 * | 3/2003 | Hashimoto | 713/320 |
| 2004/0201938 A1 * | 10/2004 | Watanabe et al. | 361/103 |
| 2005/0047233 A1 | 3/2005 | Deng | |
| 2005/0068015 A1 | 3/2005 | Hazucha et al. | |
| 2005/0094474 A1 | 5/2005 | Deng et al. | |
| 2005/0128789 A1 | 6/2005 | Houston | |
| 2005/0219776 A1 * | 10/2005 | Yamashita | 361/18 |
| 2006/0200729 A1 * | 9/2006 | Ito et al. | 714/763 |
| 2007/0019489 A1 * | 1/2007 | Herbert et al. | 365/211 |

OTHER PUBLICATIONS

Sakurai, Takayasu; "Perspectives on Power-Aware Electronics"; 2003 IEEE International Solid-State Circuits Conference; 2003; 16 pgs.; IEEE.

Tschanz, James et al.; "Dynamic Sleep Transistor and Body Bias for Active Leakage Power Control of Microprocessors"; IEEE Journal of Solis-State Circuits; Nov. 2003; pp. 1838-1845; vol. 38, No. 11; IEEE.

* cited by examiner

Primary Examiner—Amir Zarabian
Assistant Examiner—Anthan T Tran
(74) Attorney, Agent, or Firm—Robert L. King; David G. Dolezal

(57) ABSTRACT

A circuit and method efficiently powers a static storage element during a low voltage mode of operation. The static storage element is powered at a first voltage level in an active mode of the static storage element. The static storage element is powered in a low power mode using alternating first and second phases. Powering the static storage element during the first phases in the low power mode includes powering the static storage element at or below a second voltage level, wherein powering the static storage element during the second phases in the low power mode includes powering the static storage element at a higher voltage level than the second voltage level. In another form two modes of low power operation are used where a first mode uses a less power efficient operation than the second mode, but both are more power efficient than a normal power mode.

21 Claims, 10 Drawing Sheets

# METHOD FOR POWERING AN ELECTRONIC DEVICE AND CIRCUIT

CROSS REFERENCE TO RELATED APPLICATION

This application is related to our copending U.S. application Ser. No. 11/469,074, now U.S. Pat. No. 7,400,545, entitled "Storage Circuit With Efficient Sleep Mode and Method" filed of even date herewith and assigned to the assignee hereof.

FIELD OF THE INVENTION

This invention relates generally to semiconductors, and more specifically, to power conservation in semiconductor circuits.

BACKGROUND OF THE INVENTION

Memory circuits are commonly found in many electronic devices and must obtain a continuous supply of power to retain data. Such memories are often used within battery-powered wireless products where power consumption is one of the most important design considerations. Others have implemented battery-powered wireless products with memory circuits that transition from an active mode to a sleep mode operation that consumes less power. However, as transistor dimensions shrink, the transistor current leakage increases proportionately. Transistor current leakage results from a sum of sub-threshold leakage current, gate leakage and diode leakage current. The transistor current leakage requires memories to be powered when in the sleep mode operation. To reduce current leakage during a sleep mode of operation the supply voltage may be lowered. Alternatively, the ground or low voltage may be increased to reduce the voltage differential between the high voltage terminal and the low voltage terminal. However, sufficiently lowering the high voltage or increasing the ground reference may result in an increase in diode current that becomes significant relative to savings in the gate current and the sub-threshold current. As devices are made smaller, heavier doping is required to control short channel effects. The heavier doping that is found in smaller semiconductor devices limits sub-threshold current with scaling but increases a transistor's diode leakage. The diode leakage can result in a loss of data in a low power or sleep mode of operation.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
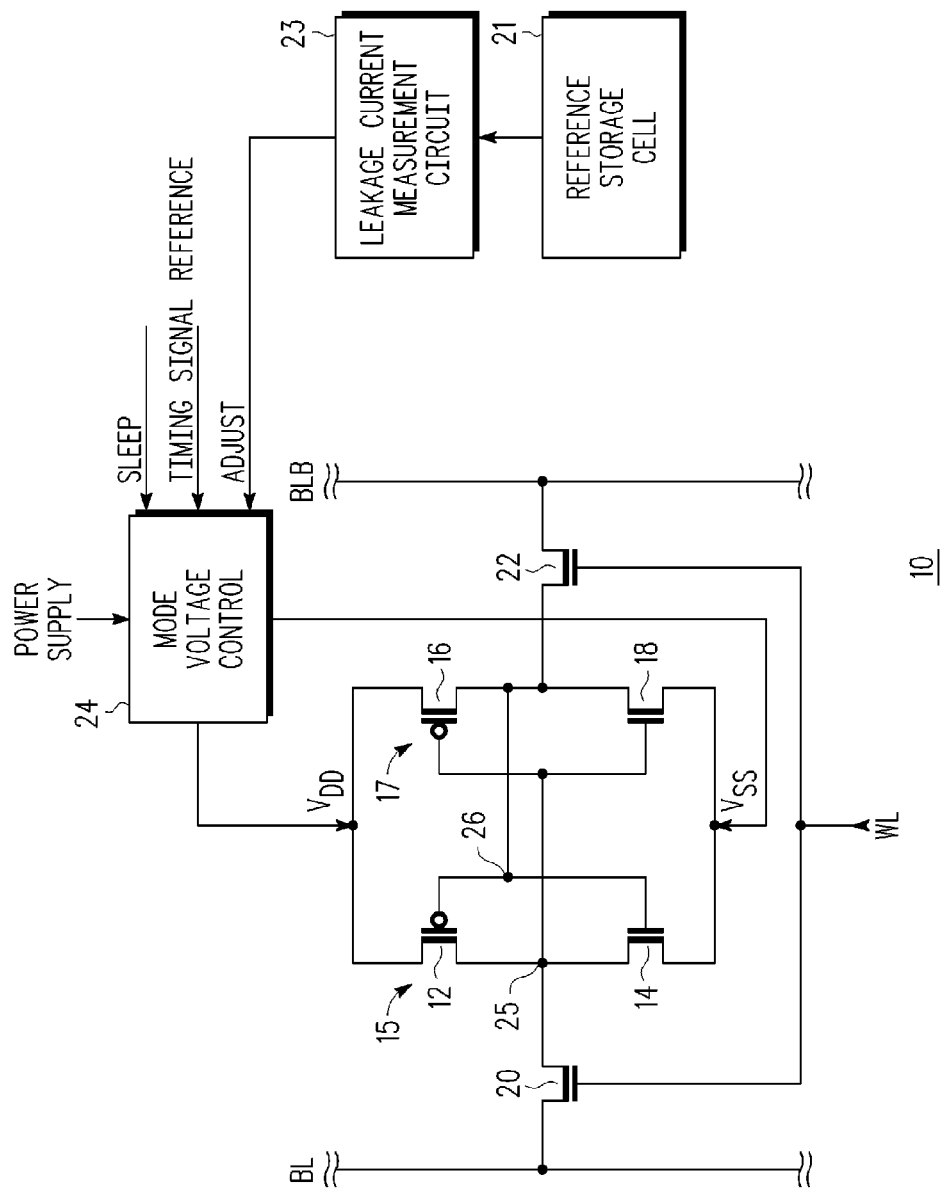
FIG. 1 illustrates in schematic diagram form one example of a storage circuit having a power conservation mode.

Illustrated in FIG. 1 is a static storage circuit 10 that operates in a normal power mode of operation and in a sleep mode of operation. Static storage circuit 10 has a stack of transistors 15 and a stack of transistors 17. The stack of transistors 15 has a plurality of transistors. In the illustrated form two transistors are provided but any number of additional transistors may be used. A P-channel transistor 12 has a source connected to a terminal for receiving a power supply voltage labeled $V_{DD}$. A gate of transistor 12 is connected to a gate of an N-channel transistor 14. A drain of transistor 12 is connected to a drain of transistor 14 at a storage node 25. A source of transistor 14 is connected to a terminal for receiving a power supply voltage labeled $V_{SS}$. In a typical form the $V_{SS}$ voltage is a reference ground. The stack of transistors 17 has a plurality of transistors. In the illustrated form two transistors are provided but any number of additional transistors may be used. A P-channel transistor 16 has a source connected to the terminal for receiving the power supply voltage labeled $V_{DD}$. A gate of transistor 16 is connected to a gate of an N-channel transistor 18. A drain of transistor 16 is connected to a drain of transistor 18 at a storage node 26. A source of transistor 18 is connected to the terminal for receiving the power supply voltage labeled $V_{SS}$. An N-channel select transistor 20 has a source connected to a memory bit line conductor labeled BL. Transistor 20 has a gate connected to a word line conductor labeled WL. A drain of transistor 20 is connected to the gates of transistors 16 and 18. A select transistor 22 has a gate connected to the word line conductor labeled WL. A source of transistor 22 is connected to a complementary bit line conductor labeled BLB. A drain of transistor 22 is connected to the gates of transistors 12 and 14. Transistors 12, 14, 16, 18, 20 and 22 form a six-transistor memory cell and functions as a static random access memory (SRAM) cell. A mode voltage control circuit 24 is connected to the sources of transistors 12 and 16 for providing supply voltage $V_{DD}$ at a desired voltage value that conserves power. The mode voltage control circuit 24 has a first input for receiving a power supply voltage with an associated ground reference. A second input of the mode voltage control circuit 24 receives a Sleep mode control signal. When the Sleep mode control signal is asserted, the static storage circuit 10 is in a power saving mode of operation. A third input of the mode voltage control circuit 24 receives a timing signal reference. The timing signal reference is a clock signal that provides a reference for the timing of the static storage circuit 10. A fourth input of the mode voltage control circuit 24 receiving an Adjust signal. The Adjust signal functions to change the value of supply voltage $V_{DD}$. A leakage current measurement circuit 23 has an output that is coupled to the mode voltage control circuit 24 for providing the Adjust signal. An input of the leakage current measurement circuit 23 is connected to an output of a reference storage cell 21. The reference storage cell has the same circuitry and same types of transistors as the stack of transistors 14 and 17 and functions to mimic and track the physical operating characteristics of the stack of transistors 15 and 17.

In operation, the static storage circuit 10 functions to store a data value and complementary data value. Select transistors 20 and 22 respectively provide these values to the bit line and complementary bit line when made conductive by an asserted signal on the word line WL. When the static storage circuit 10 is being actively written or read within a certain amount of time, the mode voltage control circuit 24 operates to provide supply voltage $V_{DD}$ as a full rail or power supply value that is at its total value according to the specification. When a certain amount of inactivity occurs for a specified time period, the Sleep mode control signal is asserted. The Adjust signal is used to variably reduce the value of supply voltage $V_{DD}$. The reference storage cell 21 is monitored by the leakage current measurement circuit 23 to determine how much leakage current is occurring for the same value of supply voltage $V_{DD}$. The leakage current measurement circuit 23 measures the leakage current and provides that value to the mode voltage control circuit 24. In response the mode voltage control circuit 24 correlates the leakage current determined to exist within the reference storage cell 21 and provides an appropriate value of $V_{DD}$.

Figure 2:
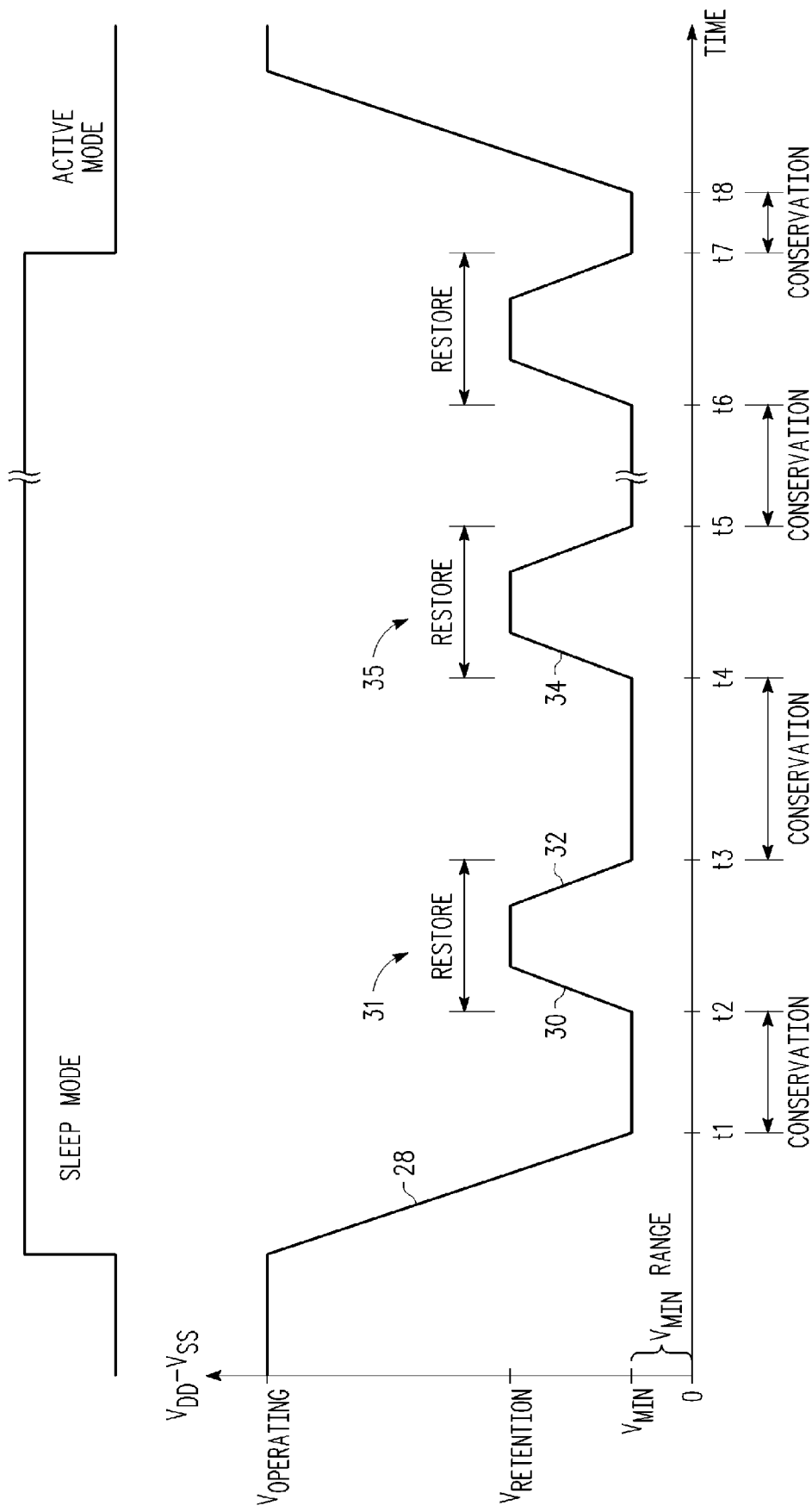
FIG. 2 illustrates in graphical form one implementation of waveforms associated with the power supply of the storage circuit of FIG. 1.

For further explanation of the operation of static storage circuit 10 a discussion of several examples will be provided. Illustrated in FIG. 2 is one possible example of waveforms for the supply voltage $V_{DD}$ during the Sleep mode. The Sleep mode signal is illustrated in FIG. 2 as defining a transition from an active mode to a sleep mode and back to an active mode. On the vertical axis is illustrated the supply voltage values which vary from zero to the difference between $V_{DD}$ and $V_{SS}$. Where $V_{SS}$ is a ground potential the operating voltage is a full $V_{DD}$ value. When the static storage circuit 10 transitions from the active mode to the sleep mode, the value of $V_{DD}$ transitions at a slope 28 to a minimum value. The slope 28 is determined by the impedance of the static storage circuit 10 and the associated power conductor grid. The minimum value of the power supply may be any value within a range of zero (i.e. earth ground) to a predetermined minimum and may be considered a voltage level at which a charge conservation phase exists. It should be understood that the voltage variation between the operating value for $V_{DD}$, $V_{OPERATING}$, and the predetermined minimum is at least five percent (5%) of the value of $V_{DD}$. That percentage ensures that the voltage differential between an active mode and a sleep mode is greater than any noise that may be introduced into the power supply voltage.

Applying the predetermined minimum voltage value to the static storage circuit 10 represents a conservation phase of voltage operation of the static storage circuit 10. During this time frame there is either no new charge being provided to the storage cell of the static storage circuit 10 or otherwise not enough sustaining charge for long-term operation. The first conservation phase in FIG. 2 is represented as existing between time t1 and time t2 when the supply voltage is at the $V_{MIN}$ voltage level. Between time t2 and time t3 the static storage circuit 10 is in a restore phase 31 in which charge is being restored to the memory cell of the static storage circuit 10. During the restore phase 31 the supply voltage $V_{DD}$ is above the $V_{MIN}$ voltage level and transitions from the minimum voltage value to a retention voltage, $V_{RETENTION}$, that is sufficient to reinforce the originally stored charge at the storage nodes 25 and 26. The rate of change of slope 30 is a predetermined amount based on the response characteristics of the storage nodes 25 and 26. In this manner the rate of change of voltage at the one of the storage nodes 25 and 26 having a logic one value closely tracks the rate of change of the power supply voltage $V_{DD}$. The value of the restore voltage reaches the retention voltage and remains at this voltage for a time determined by the mode voltage control circuit 24. After a predetermined amount of time at this voltage, the power supply voltage transitions back to the minimum value. The rate of change of slope 32 is also predetermined based on the response characteristics of the storage nodes 25 and 26 so that the rate of change of voltage at the storage node having the logic high value is not adversely affected. At the conclusion of time t3 the first restore phase is over and a second conservation phase begins. During the second conservation phase the power supply voltage remains at a minimum value. The second conservation phase ends at time t4. Between time t4 and time t5 a second restore phase occurs. Slope 34 represents a transition from the minimum voltage value to the voltage retention value. In one form the slope 34 is the same as slope 30. After reaching and maintaining the supply voltage at the retention voltage the voltage transitions again back to the minimum value. In this manner the power supply voltage alternates during the sleep mode between a retention value and a minimum voltage that is below a value that will sustain the charge on storage nodes 25 and 26 long-term. Between time t5 and t6 a conservation phase of indeterminate length occurs as indicated by the break in signals. At time t6 a final restore phase occurs and concludes at time t7. At time t7 the Sleep signal transitions from an active state to an inactive state signaling that an active mode of operation for static storage circuit 10 has begun. Due to some finite delay in acknowledging and responding to the active mode signal, the power supply voltage $V_{DD}$ does not begin to transition from the minimum value to the operating voltage value until time t8. The time interval between time t7 and time t8 therefore is a conservation phase. The slope of the change in voltage to the operating voltage is again determined by the impedance of the static storage circuit 10 and the associated power conductor grid. Therefore, in the FIG. 2 example a dynamic control of the supply voltage during a low power mode of operation is provided. During the low power mode the voltage is alternated between phases in which charge on charge storage nodes is restored by a sufficient voltage and phases in which charge on charge storage nodes is only conserved. During the conservation stage a supply voltage is used which is low enough that the charge is not sustainable long-term at that voltage. It should be noted the length of the restore phases and the conservation phases do not have to be the same length in time. Additionally, the length of the restore phase and the conservation phase do not have to be the same length in time. In this manner the RMS value of the supply voltage during the low power mode is substantially reduced from keeping the supply voltage at a constant lower voltage.

In another form the restore phase may be implemented by using the operating voltage rather than a retention voltage during the restore phase. By using the full operating voltage, simplification is provided since generation of a retention voltage is not required. However, the use of the full operating voltage during the restore phase means that the RMS voltage is higher and less power is conserved. However, power consumption can be modified by using a slower operating frequency with the higher restore voltage. Therefore, the exact voltage value that is used depends upon the application and is a tradeoff between a desired power consumption value and requirements of the storage circuitry.

Figure 3:
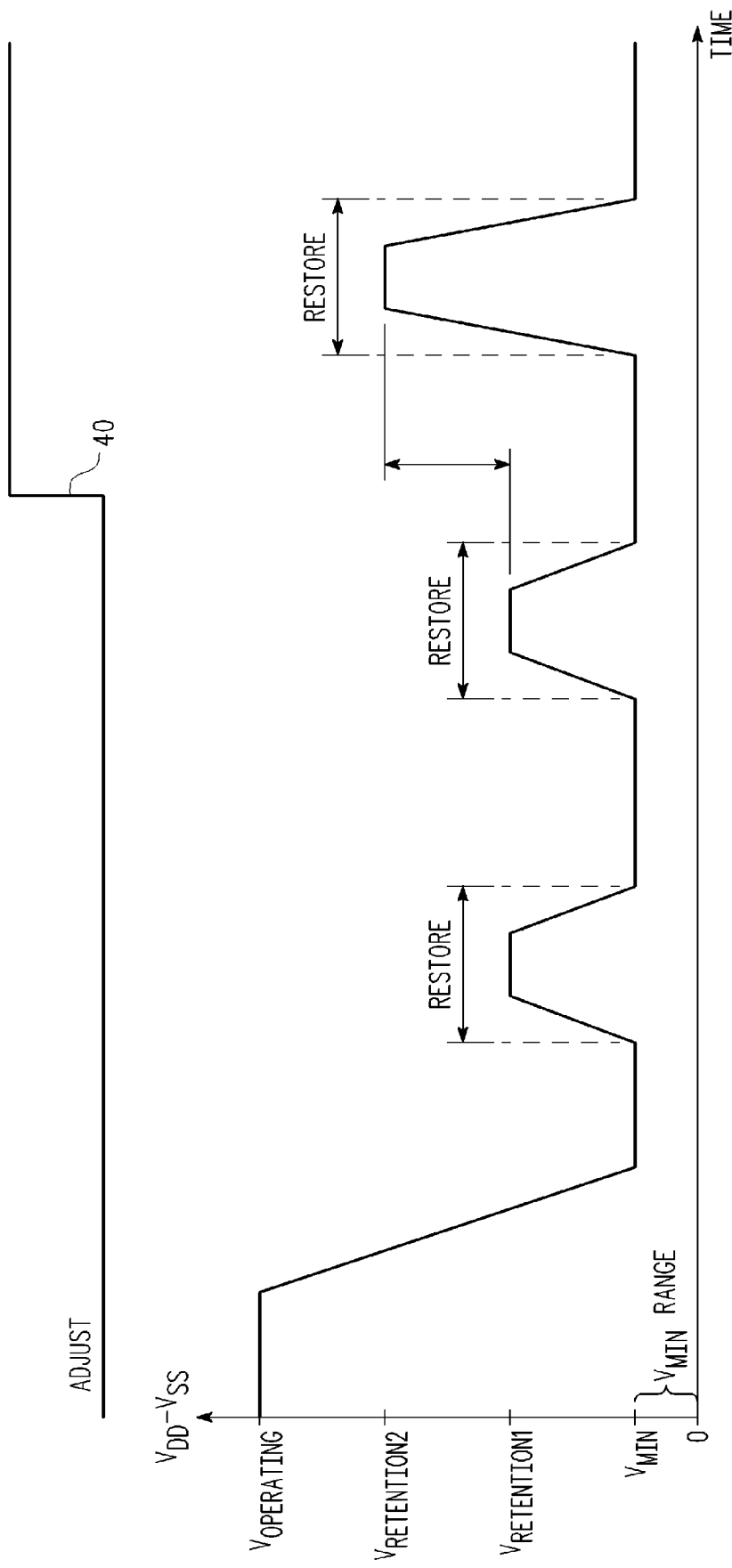
FIG. 3 illustrates in graphical form another implementation of waveforms associated with the power supply of the storage circuit of FIG. 1.

Illustrated in FIG. 3 is another example of the operation of the low power mode for a static charge storage circuit. The waveforms illustrated in FIG. 3 all occur during a low power mode which has just started. Initially the supply voltage is at its operating potential, $V_{OPERATING}$. If $V_{SS}$ is zero, the operating voltage is $V_{DD}$. As illustrated in FIG. 3 when the adjust signal of FIG. 1, identified as Adjust signal 40 in FIG. 3, assumes a first value, the restore voltage that is used is a first retention voltage labeled $V_{RETENTION\ 1}$. However, when the Adjust signal 40 has a second value and a restore phase is encountered, the supply voltage used for the retention phase is a large supply voltage, $V_{RETENTION\ 2}$. By using the Adjust signal 40 the RMS value of the restore voltage may be adjusted dynamically in response to measurements of the reference storage cell 21.

Figure 4:
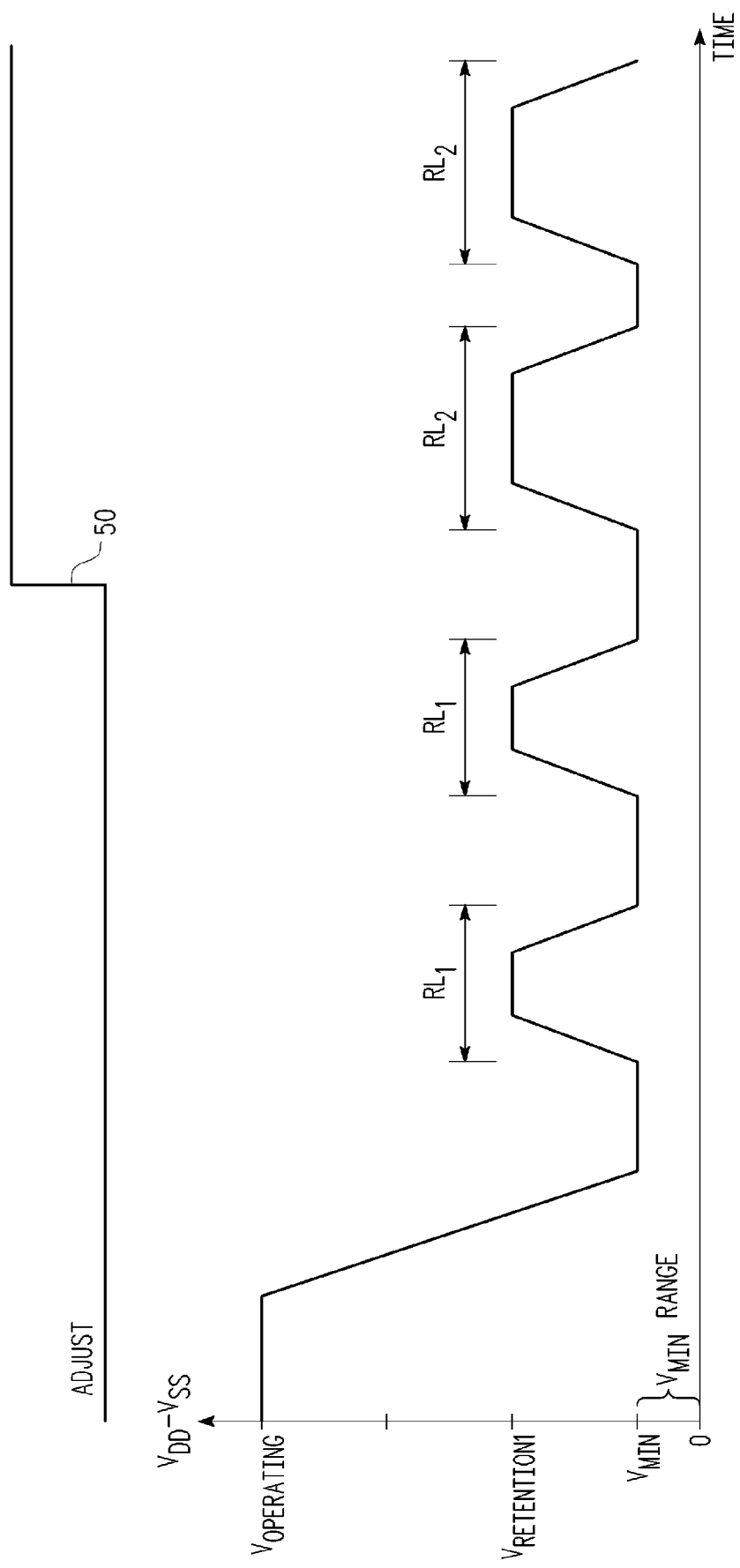
FIG. 4 illustrates in block diagram form a common mode input example of the input circuit of FIG. 2 having a second example of operating voltages.

Illustrated in FIG. 4 is another example of the operation of the low power mode for a static charge storage circuit. The waveforms illustrated in FIG. 4 also occur during a low power mode which has just started. Initially the supply voltage is at its operating potential, $V_{OPERATING}$. If $V_{SS}$ is zero, the operating voltage is $V_{DD}$. As illustrated in FIG. 4 when the adjust signal of FIG. 1, identified as Adjust signal 50 in FIG. 4, assumes a first value, the restore phase has a first restore time length, RL1, and a retention voltage labeled $V_{RETENTION\ 1}$ is used. However, when the Adjust signal 50 has a second value and a restore phase is encountered, the restore phase has a second restore time length, RL2 that is greater than the first restore time length RL1. The supply voltage used for the restore phase in this example remains supply voltage, $V_{RETENTION\ 1}$. By using the Adjust signal 50 the retention voltage is modulated. Therefore the RMS value of the restore voltage may be further adjusted dynamically in response to measurements of the reference storage cell 21 by modulation of the phase of the retention voltage.

Figure 5:
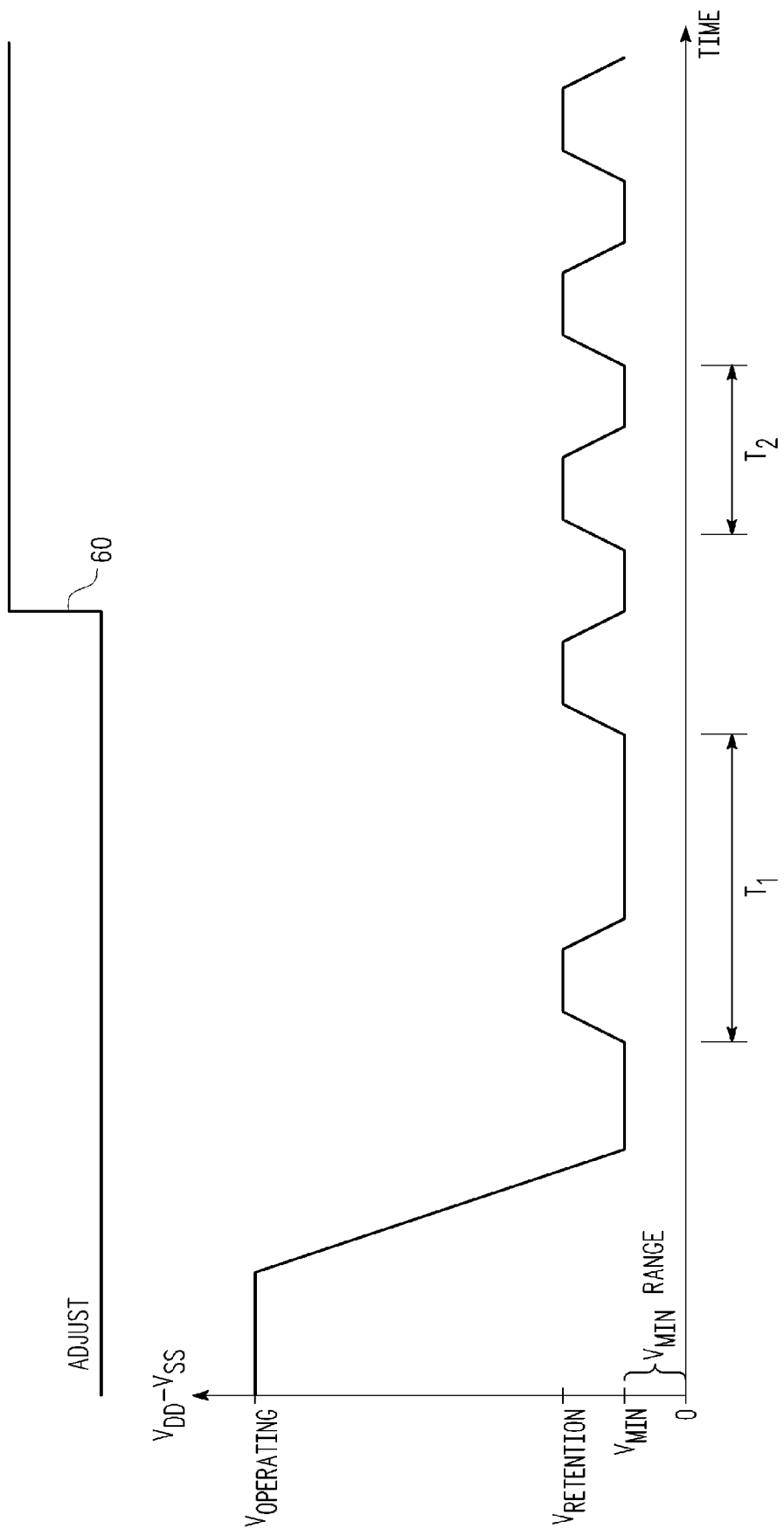
FIG. 5 illustrates in block diagram form a common mode input example of the input circuit of FIG. 2 having a third example of operating voltages.

Illustrated in FIG. 5 is a further example of the operation of the low power mode for a static charge storage circuit. The waveforms illustrated in FIG. 5 also occur during a low power mode which has just started. Initially the supply voltage is at its operating potential, $V_{OPERATING}$. If $V_{SS}$ is zero, the operating voltage is $V_{DD}$. As illustrated in FIG. 5 when the adjust signal of FIG. 1, identified as Adjust signal 60 in FIG. 6, assumes a first value, the restore phase has a first duty cycle, T1, and a retention voltage labeled $V_{RETENTION}$ is used. However, when the Adjust signal 60 has a second value and a restore phase is encountered, the restore phase has a second duty cycle, T2 that is less than the first duty cycle T1. The supply voltage used for the restore phase in this example remains supply voltage, $V_{RETENTION}$, regardless of the duty cycle selected by the value of Adjust signal 60. By using the Adjust signal 60 the frequency of the retention voltage is modulated. Therefore the RMS value of the restore voltage may be further adjusted dynamically in response to measurements of the reference storage cell 21 by modulation of the frequency of the retention voltage.

Figure 6:
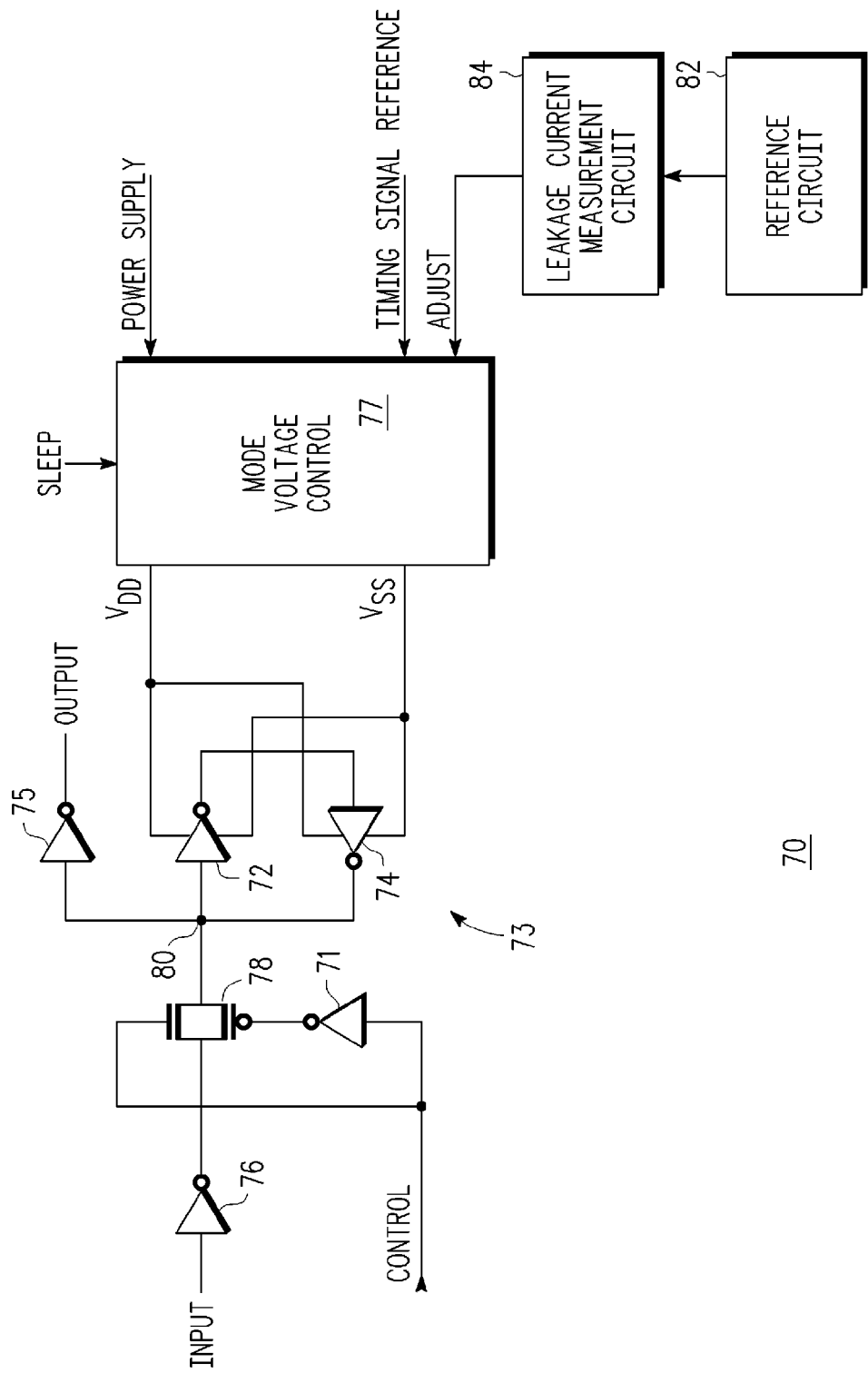
FIG. 6 illustrates in partial schematic form another example of a storage circuit having a power conservation mode.

Illustrated in FIG. 6 is a static storage circuit 70 having a storage portion 73. An input signal (INPUT) is connected to an input of an inverter 76. An output of inverter 76 is connected to a first terminal of a switch 78. In one form switch 78 is implemented as a complementary metal oxide semiconductor (CMOS) transmission gate. The CMOS transmission gate is formed by a parallel connected N-channel transistor and P-channel transistor. A second terminal of switch 78 is connected to an input of an inverter 72 at a charge storage node 80. A control signal (CONTROL) is connected to a first control terminal of switch 78 which is the gate of the N-channel transistor of switch 78. An output of inverter 71 is connected to a second control terminal of switch 78 which is the gate of the P-channel transistor of switch 78. An output of inverter 72 is connected to an input of an inverter 74. An output of inverter 74 is connected to charge storage node 80 and to an input of an inverter 75. An output of inverter 75 provides a data output (OUTPUT). A supply voltage $V_{DD}$ is connected to a first power terminal of each of inverter 72 and inverter 74. A supply voltage $V_{SS}$ is connected to a second power terminal of each of inverter 72 and inverter 74. A mode voltage control circuit 77 provides the power supply voltages $V_{DD}$ and $V_{SS}$. The mode voltage control circuit 77 has a first input for receiving a sleep mode signal (SLEEP), a second input for receiving a power supply voltage and associated ground reference, POWER SUPPLY, a third input for receiving a timing signal (TIMING SIGNAL REFERENCE) and a fourth input for receiving an adjustment signal (ADJUST). The mode voltage control circuit 77 is analogous to mode voltage control circuit 24 of FIG. 1. A reference circuit 82 is provided and has an output connected to an input of a leakage current measurement circuit 84. The reference circuit 82 is formed of a duplicative circuit of inverters 71, 72, 74, 75 and 76 and switch 78. Reference circuit 82 therefore functions as a reference or mirror of the charge storage node 80. An output of the leakage current measurement circuit 84 is connected to the fourth input of the mode voltage control circuit 77 and provides the adjustment signal.

In operation, the static storage circuit 70 functions to efficiently store a data value at the storage node 80. The static storage circuit 70 may transition between an active mode of operation in which an operating voltage is used for VDD and a sleep mode of operation in which a changing lower voltage is used for VDD. In addition to the lower voltage varying periodically, the changing lower voltage may be implemented with differing maximum values (FIG. 3), differing duty cycle or phase (FIG. 4) or differing frequency or length (FIG. 5). These differing voltages during the low power mode provide flexibility in determining how much RMS energy will exist to efficiently maintain a data value on the storage node. The timing signal that is connected to the mode voltage control circuit 77 functions as a reference to create the timing for the changing or switching of the power supply voltage between a retention value and a minimum value. It should be apparent that the methods described herein may be used in a variety of types of static storage circuits and is not restricted to the circuit implementation of the storage device.

Figure 7:
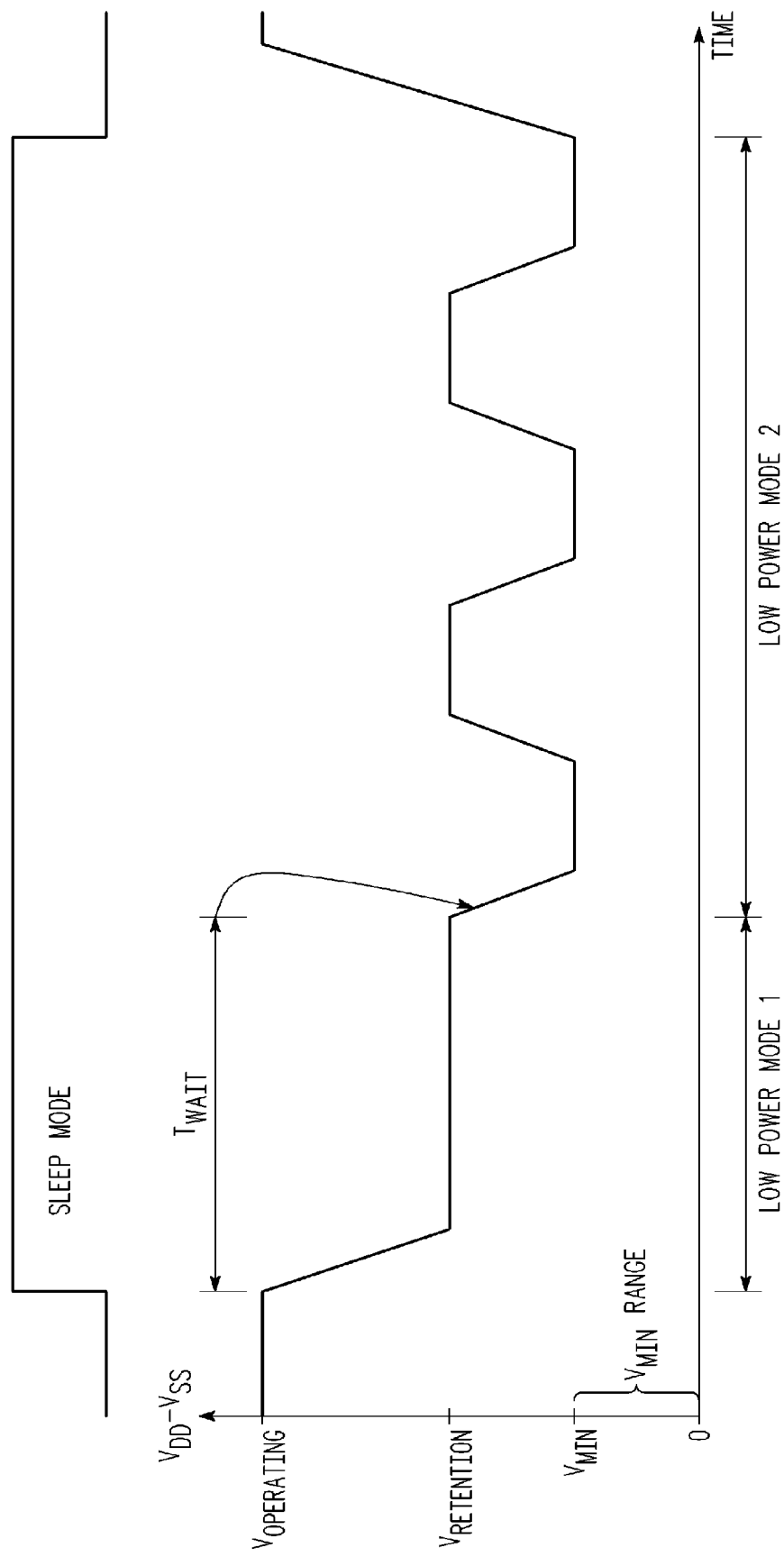
FIG. 7 illustrates in graphical form waveforms associated with utilizing two different power conversation modes in any of the previously illustrated circuits.

Illustrated in FIG. 7 is a graph of a low power mode of operation of a storage circuit. Prior to the beginning of a sleep mode operation, the power supply voltage that is supplied to a static charge storage circuit is a predetermined operating voltage, $V_{OPERATING}$. Such voltage is whatever specification voltage is required and varies depending upon the type of memory and the semiconductor manufacturing process. At the beginning of a sleep mode as indicated by the Sleep signal transitioning to a high value, the supply voltage declines to a predetermined retention voltage, $V_{RETENTION}$. The retention voltage is a voltage that will sustain adequate charge on the storage node of the static charge storage circuit. In the illustrated form, the low power voltage remains constant and at the retention voltage value. This operation is described as a low power mode 1 and this first mode is illustrated as having a time duration of $T_{WAIT}$. This initial wait period or wait region places the power supply voltage at the lowest steady state retention voltage labeled $V_{RETENTION}$. The time duration of $T_{WAIT}$ may be determined in several differing methods. In one form the value of $T_{WAIT}$ may be a predetermined fixed time which is counted. In another form the value of $T_{WAIT}$ may be dependent upon the measured leakage current of a reference circuit. In this form the value of $T_{WAIT}$ may vary between different low power modes. After the end of $T_{WAIT}$, a second low power mode is entered. The second low power mode has a lower RMS voltage than the first low power mode. It should be understood that a reverse order of lower RMS voltage and higher RMS voltage may be used. The use of two different types of low power modes of differing RMS supply voltage provides power savings from a conventional low power mode having a continuous supply voltage with a value that is a retention voltage value.

Figure 8:
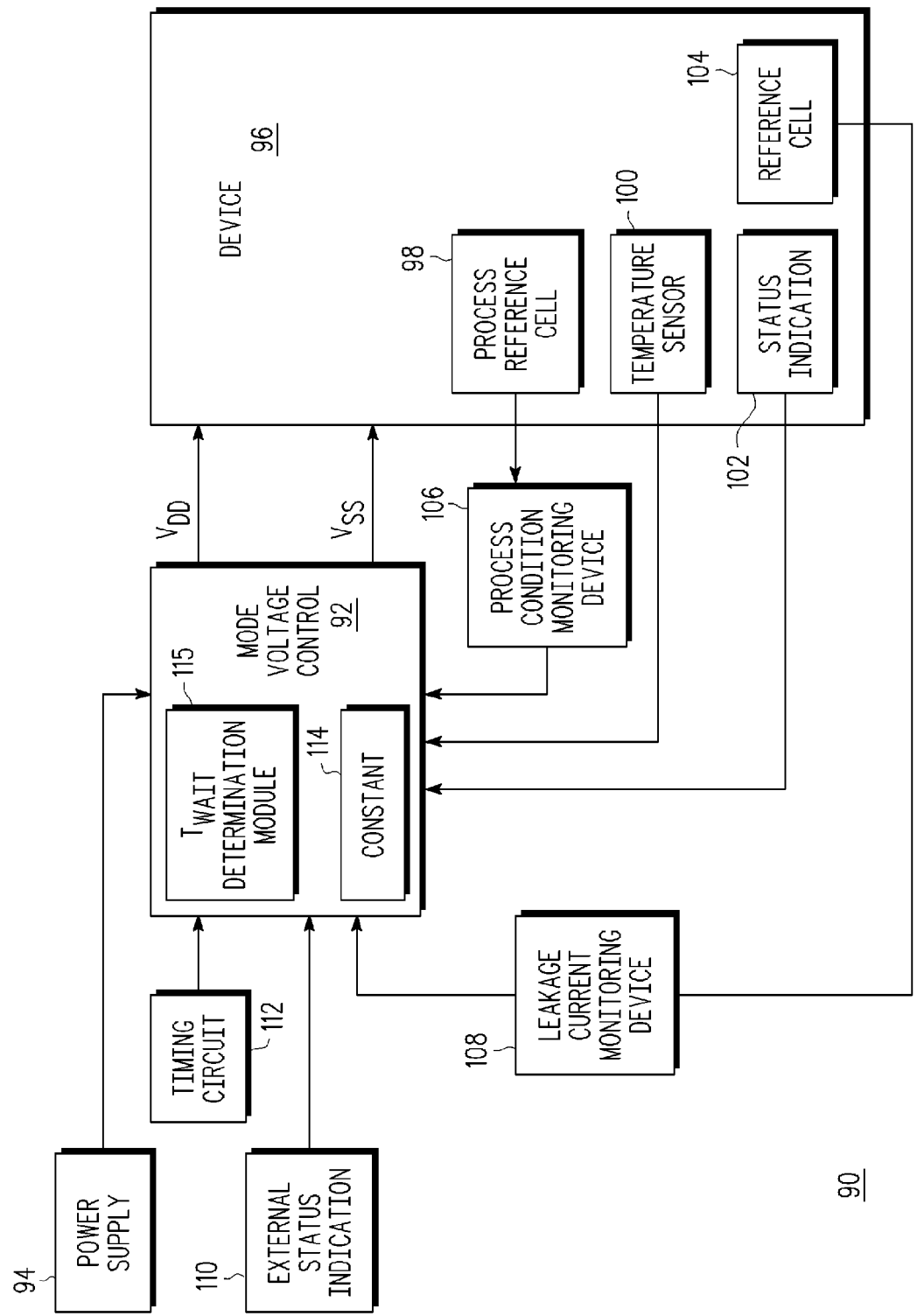
FIG. 8 illustrates in block diagram form a semiconductor device having power mode circuitry for use in efficiently powering the semiconductor device.

Illustrated in FIG. 8 is a circuit 90 for implementing a multiple low-power mode static storage device in which two or more differing types of low power techniques are used during a sleep mode of a static storage device. A mode voltage control circuit 92 has a first voltage output terminal connected to a first voltage input terminal of a device 96 for providing a varying supply voltage $V_{DD}$. In one form the device 96 is a static storage device for storing information. Other functional devices may however be implemented such as any low power communications device, wireless sensors, transceivers, etc. A second voltage output terminal is connected to a second voltage input terminal of device 96 for providing the supply voltage $V_{SS}$. Within the mode voltage control circuit 92 is a module labeled $T_{WAIT}$ Determination Module 115 for determining the time duration of $T_{WAIT}$. Also within the mode voltage control circuit 92 is Constant circuitry 114 for providing constant values which define the amount of RMS voltage that will be required for the power supply voltage in the second low power mode in response to one or more physical characteristics of device 96 or one or more environmental characteristics of device 96. A power supply 94 is connected to a power terminal of the mode voltage control circuit 92 along with an associated reference ground terminal. A timing circuit 112 provides a timing signal and is connected to a timing input of the mode voltage control circuit 92. An external status indication circuit 110 has an output that is connected to a first status or mode input of the mode voltage control circuit 92. An example of status information is identification of an operating state of device 96 such as whether an active circuit mode or an inactive (i.e. sleep) circuit mode of operation exists. Another operating status indication includes an operating condition external to device 96 such as a communications protocol state of a system implementing device 96. Other forms of status identification may be implemented such as an estimate of time indicating to the mode voltage control circuit 92 when a change to active mode should be implemented. Within the device 96 is a process reference cell 98. The process reference cell 98 has an output connected to an input of a process condition monitoring device 106. An output of the process condition monitoring device 106 is connected to a process input of the mode voltage control circuit 92. A temperature sensor 100 within the device 96 has an output connected to a temperature input of the mode voltage control circuit 92. A status indication circuit 102 within the device 96 has an output connected to a second status input of the mode voltage control circuit 92. An example of the status information is a type of communication protocol information that circuit 90 might be storing or being used in. A reference cell 104 is provided within device 96. The reference cell 104 has an output connected to an input of a leakage current monitoring device 108. An output of the leakage current monitoring device 108 is connected to a current input of the mode voltage control circuit 92.

In operation, circuit 90 uses the mode voltage control circuit 92 to adjust the power supply voltage to device 96 between two or more different methodologies of low power management when device 96 is placed into a low power or sleep mode. In a first low power method the supply voltage $V_{DD}$ is reduced to a predetermined fixed retention voltage and maintained at that voltage for an initial period of time. The retention voltage is a voltage adequate to sustain a data value at a storage node. The supply voltage $V_{SS}$ is maintained constant. However, in other forms the $V_{DD}$ voltage may be kept constant and $V_{SS}$ increased or a combination of both. The retention voltage is sustained for a time period that is a function of one or more predetermined physical characteristics of the device 96 and/or one or more predetermined environmental characteristics of the device 96. As an example of physical characteristics of device 96, the leakage current of the storage transistors used to store information is measured. Based upon the value of the measured leakage current the initial period of time is determined by determination module 115. In one form a specific one of various time periods can be correlated with the measured leakage current to determine the initial time period value. In other forms a calculation may be implemented using the measured leakage current and other factors discussed herein. Other physical characteristics include the total capacitance associated with the power supply that is providing $V_{DD}$ and $V_{SS}$. Other physical characteristics include the process parameters associated with the transistors, such as transistor threshold voltage or transistor saturation current, and process parameters associated with conductors of the device 96. In contrast, the environmental characteristics include the transistor junction temperature of transistors within device 96. Other environmental characteristics include an operating state of device 96. In one embodiment, the operating state may vary dynamically as device 96 performs processing of one or more communication protocols. Depending upon the specifics of the communications protocol, device 96 may transition through a number of protocol states which implement the protocol. In certain of these states, device 96 may be able to operate in a low power mode while waiting for a particular arrival of time or waiting for other control information associated with the protocol. Time Division Multiple Access (TDMA) or other time-slotted communications protocols may be implemented by device 96, and in certain operating states of the protocol, device 96 may need to suspend activity for a varying amount of time, waiting on the next active interval of the TDMA protocol. The waiting interval may depend upon additional factors associated with the current mode or state of the operating protocol. Depending upon the amount of time device 96 is expected to stay in a low-power mode, a transition to a second type of low power operation may be avoided. In that situation the calculated $T_{WAIT}$ value is not a small enough percentage of the entire low-power mode to justify using two types of low-power operation. Therefore, the entire low-power mode is selectively spent in a single type of low-power operation. The amount of time anticipated for the low-power mode may be determined as an estimate by using the status indication from device 96 or from external status indication 110. For example, the low power activity of a specific communication protocol may be characterized relative to another communication protocol. Because in one embodiment the transition into and out of the lowest power mode (for example, mode 2 in FIG. 7) consumes additional energy due to the slewing of operating voltage supplied by mode voltage control circuit 92, the time interval spent in low power mode 2 may not always be sufficient to result in an overall energy savings relative to simply remaining in low power mode 1 of FIG. 7. The $T_{WAIT}$ determination module 115 is thus utilized to provide a varying value for time $T_{WAIT}$ which attempts to optimize overall energy consumption, based on the factors described earlier.

Figure 9:
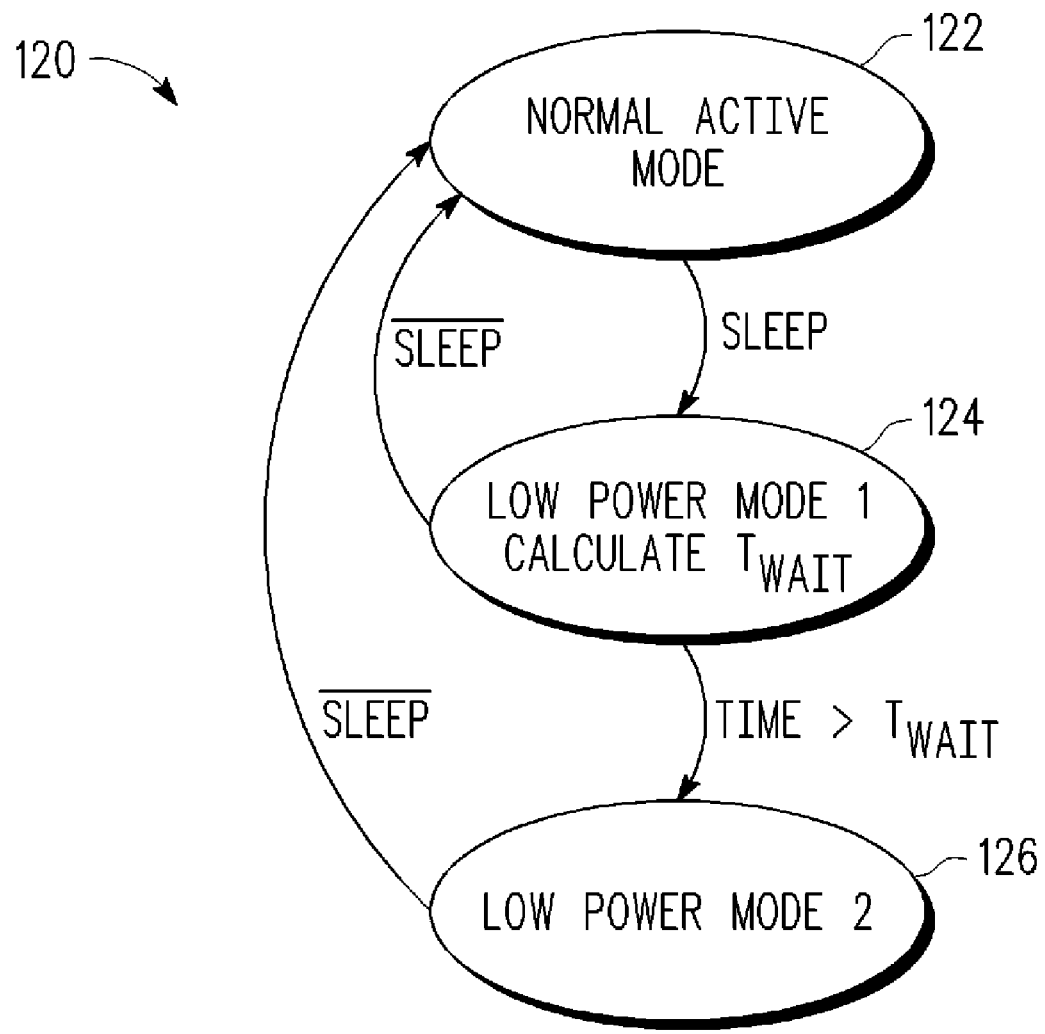
FIG. 9 illustrates in flowchart form a method for powering an electronic device.

Illustrated in FIG. 9 is a flowchart that implements a method 120 for low power management of a static storage device by selectively using two different modes when in a low power or sleep mode of operation. In a step 122 a normal active mode is present. In the normal active mode the value of the power supply voltage is the full value of the specified required power. A sleep mode of operation is acknowledged and in a step 124 a first low power mode, low power mode 1, is entered. In the first low power mode a length of time for the first mode is determined based upon either a physical characteristic of the device in low power mode or an environmental characteristic of the device. This time is referred to as $T_{WAIT}$. If the determined time for $T_{WAIT}$ is more than an amount of time, labeled "TIME", that may have any variable value, all of the low power mode is spent in the first low power mode. Upon time to reenter the normal active mode of operation, the normal active mode of operation is entered directly from the first low power mode. If the determined time for $T_{WAIT}$ is less than the amount of time, a step 126 is implemented in which a second mode of low power operation is entered. The device remains in the second mode of low power prior to reentering the normal active mode. It should be noted by selectively combining two modes of low power operation, leakage power in mobile wireless devices during a low power mode is reduced.

In one embodiment the variable amount of time, TIME, may be due to one or more particular communications protocols implemented by device 96, and the current state of the one or more protocols, which may also be signaled as an environmental variable or as a status indication, such as from external status indicator 110, or from another state contained within circuit 90 in FIG. 8, either within or external to device 96.

In another embodiment, the amount of time, TIME, may be predetermined at the time a decision to enter a low power state is made. If the predetermined amount of time is sufficient to result in an overall energy savings by utilizing lower power mode 2, the calculated value for $T_{WAIT}$ provide by $T_{WAIT}$ determined module 115 may be reduced to a minimal interval, thus providing additional energy savings.

In yet another embodiment the amount of time, TIME, spent in the sleep state may not be exactly predetermined by the $T_{WAIT}$ determination module 115, but may be probabilistically estimated by $T_{WAIT}$ determination module 115 based upon one or more factors described earlier, such as an environmental factor, or a status indication provided. $T_{WAIT}$ determination module 115 may advantageously use this probable estimate to calculate an interval $T_{WAIT}$ which on a probabilistic level optimizes the overall amount of energy utilized to retain the state of device 96.

Figure 10:
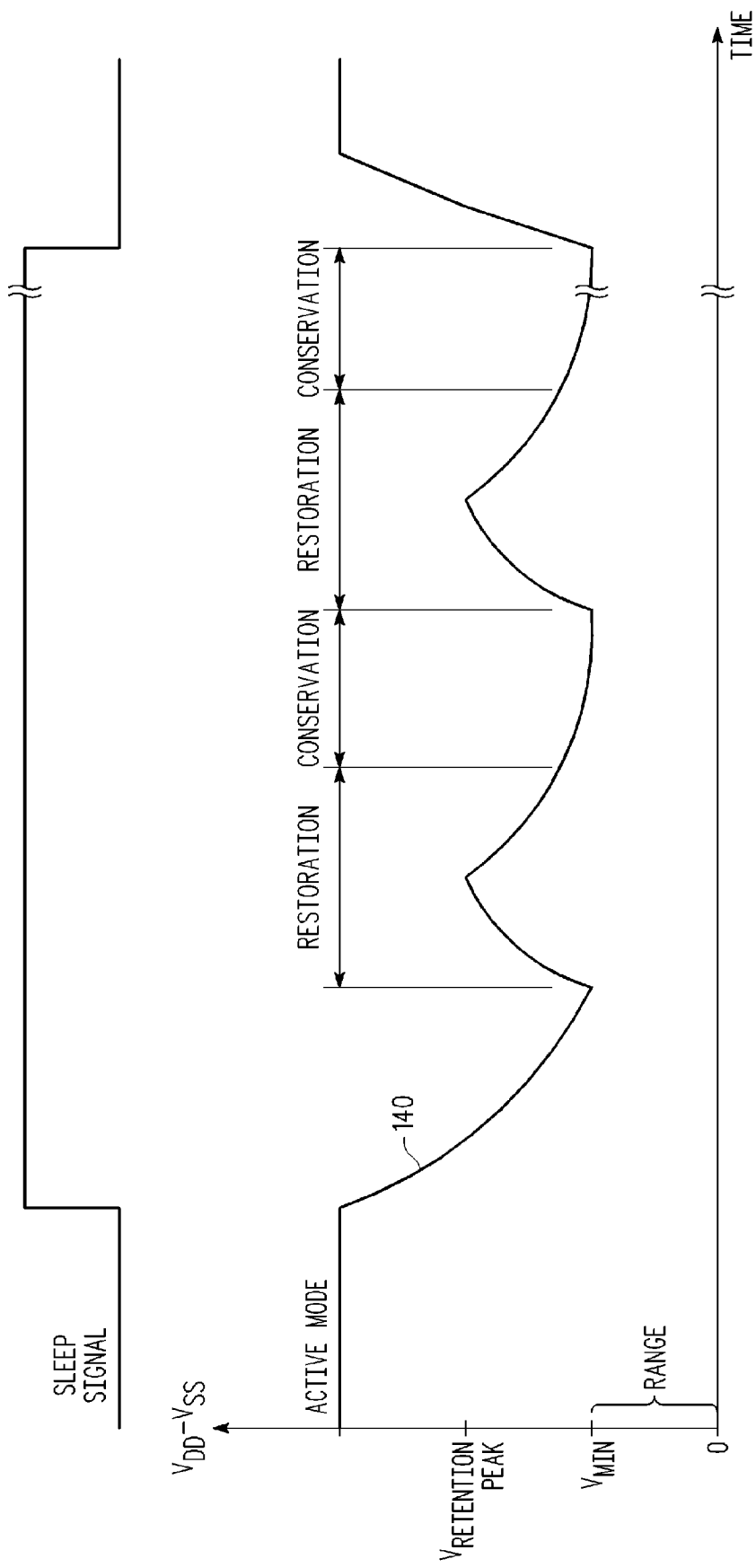
FIG. 10 illustrates in graphical form another implementation of waveforms associated with the power supply of the storage circuit of FIG. 1 or FIG. 6.

Illustrated in FIG. 10 is a waveform of another implementation of a low power method. A graph of the supply voltage versus time is again illustrated. Assume that initially a device is in an active mode of operation. The supply voltage is at whatever specified voltage is required for the device to be active. After an elapse of time a sleep signal is asserted. The supply voltage declines with a nonlinear slope that is proportional to the capacitance of power supply. In this implementation a pulse width modulated (PWM) supply voltage is connected to a gate of a transistor (not shown). The transistor is coupled between a capacitor (not shown) and the PWM supply voltage. As the pulse turns the transistor on and off the voltage across the capacitor rises and falls in a nonlinear manner as shown in FIG. 10 in accordance with a resistor/capacitor (RC) time constant. When the voltage across the capacitor exceeds a predetermined voltage level and remains greater than that voltage level, a charge storage node of the device is being restored with charge. When the voltage across the capacitor is less than the predetermined voltage level, charge on the charge storage node is conserved. In the conservation phase the supply voltage is not sufficient enough to retain adequate charge on a charge storage node to protect stored information on a long-term basis. The restoration and conservation phases of the low voltage mode are detailed in FIG. 10. In this form the supply voltage waveform during the low power mode is nonlinear rather than having the pulse shapes of the earlier voltage/time examples. However, the operation during the low power mode is analogous to that previously detailed. When the sleep signal is de-asserted the low power mode terminates with the supply voltage transitioning back to a constant voltage at the active mode value. The transition from the low voltage mode to the active mode is nonlinear because the capacitor referenced above charges back to active mode value. Once fully charged to the active mode voltage the voltage across the capacitor is constant during the active mode of operation. As in the prior examples, the RMS voltage value of the power supply during the low voltage mode of operation is significantly lower than if the voltage were set at a constant voltage sufficient to retain charge on the storage node.

By now it should be appreciated that there has been provided methods and circuits for implementing an efficient low power mode of operation for a memory, such as a static storage device. During the low power mode of operation the power supply voltage to a storage device is lowered to a retention voltage to retain the state of stored information. In one form the method allows the power supply voltage to be modulated between the retention voltage and a voltage value that is less than the retention voltage. The power supply voltage may be modulated by modulating the frequency, the duty cycle (pulse widths) or voltage value to vary the RMS value of the power supply. Thus the effective power consumed during the low power mode is less than the retention voltage and therefore the leakage power has been reduced.

In the foregoing specification, the invention has been described with reference to specific embodiments. However, one of ordinary skill in the art appreciates that various modifications and changes can be made without departing from the scope of the present invention as set forth in the claims below. For example, various types of transistors may be implemented to form the described static charge storage devices. A combination of process and environmental factors may be used to determine the initial wait period for the first low power mode. The values of power supply voltage may change significantly based upon process technology.

In one form there is provided a method for powering a device. The device is powered in an active mode and the device is powered in a first low power mode. A time interval is determined during an operation of the device, the determining a time interval including determining based upon an operating status. A transition occurs from powering the device in the first low power mode to powering the device in a second low power mode if the powering the device in the first low power mode includes powering the device in the first low power mode for a greater amount of time than the time interval. In one form the determining a time interval includes determining further based upon an operating characteristic of the device. In another form the operating characteristic of the device includes the temperature of the device. In another form the operating characteristic of the device includes an operating frequency of the device. In another form the powering the device in the active mode includes powering the device at a first voltage level and the operating characteristic of the device includes a value of the first voltage level. In another form the operating characteristic of the device includes a measured leakage current of the device. In one form the device is a static storage element and the operating characteristic is a measured voltage of a storage node of the static storage element during the powering in the first low power mode. In another form determining a time interval includes determining further based upon a process characteristic of the device. In yet another form a process characteristic includes one of a group consisting of a threshold voltage of a transistor of the device and a saturation current of a transistor of a device. In another form the operating status includes an operating state of the device. In one form the operating status includes an operating condition external to the device. In another form the operating condition external to the device includes a communications protocol state of a system implementing the device. In another form the operating status includes an estimate of time when the device is returning to an active mode. In yet another form the time interval is dependent upon an energy amount to transition to the second low power mode from the first low power mode and an energy amount to transition from the second low power mode. In yet another form the powering the device in the active mode includes supplying power at a first voltage level. Powering the device in the first low power mode includes powering the device at a second voltage level, the second voltage level being a lower voltage level than the first voltage level. Powering the device in the second low power mode includes powering, for at least a portion of powering of the device in the second low power mode, the device at or below a third voltage level, the third voltage level being lower than the second voltage level. In another form the powering the device in the second low power mode includes powering the device during alternating first type phases and second type phases in the second low power mode. In this form the powering the device during the first type phases in the second low power mode includes powering the device at or below a first voltage level, wherein powering the device during the second type phases in the second low power mode includes powering the device at a higher voltage level than the first voltage level. In another form the determining a time interval during an operation of the device occurs during the powering the device in the first low power mode. In yet another form the device includes a static storage element, wherein the powering the device comprises powering the static storage element. In one form the static storage element includes a static RAM memory cell, where the powering the device comprises powering the static RAM memory cell.

There is also provided a method for powering a device in an active mode and in a first low power mode. A time interval is determined during an operation of the device. The device transitions from being powered in the first low power mode to being powered in a second low power mode if the powering the device in the first low power mode is for a greater amount of time than the time interval. Powering the device in the second low power mode includes powering the device during alternating first type phases and second type phases in the second low power mode. Powering the device during the first type phases in the second low power mode includes powering the device at or below a first voltage level. Powering the device during the second type phases in the second low power mode includes powering the device at a higher voltage level than the first voltage level. There is also provided a system including a device having a first power rail and a second power rail. A voltage mode control circuit is coupled to the device and includes an input to receive an operating mode signal indicative of a desired operating mode of the device. The voltage mode control circuit controls a voltage differential across the first power rail and the second power rail such that in an active mode, the voltage differential is at a first voltage level. In a first low power mode, the voltage differential is at a second voltage level lower than the first voltage level. In a second low power mode, the voltage differential is at a third voltage level for at least some portion of the second low power mode, wherein the third voltage level is less than the second voltage level. The voltage mode control circuit is configured to transition from powering the device in the first low power mode to powering the device in the second low power mode if the powering the device in the first low power mode includes powering the device in the first low power mode for a greater amount of time than a time interval. The voltage mode control circuit includes a first input for receiving an indication of an operating status. The time interval is based upon the operating status.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. It should be understood that all circuitry described herein may be implemented either in silicon or another semiconductor material or alternatively by software code representation of silicon or another semiconductor material.

What is claimed is:

1. A method for powering a device comprising:
   implementing the device as a static storage element;
   powering the device in an active mode;
   powering the device in a first low power mode;
   determining a time interval during an operation of the device, the determining the time interval comprises determining based upon an operating status; and
   directly transitioning from powering the device in the first low power mode to powering the device in a second low power mode if the powering the device in the first low power mode includes powering the device in the first low power mode for a greater amount of time than the time interval, the second low power mode comprising using a supply voltage having a different RMS value than during the first low power mode.

2. The method of claim 1 wherein the determining a time interval includes determining further based upon an operating characteristic of the device, wherein the time interval varies in response to the operating characteristic varying.

3. The method of claim 2 wherein the operating characteristic of the device includes the temperature of the device.

4. The method of claim 2 wherein the operating characteristic of the device includes an operating frequency of the device.

5. The method of claim 2 wherein:
the powering the device in the active mode comprises powering the device at a first voltage level; and
the operating characteristic of the device comprises a value of the first voltage level.

6. The method of claim 2 wherein the operating characteristic of the device includes a measured leakage current of the device.

7. The method of claim 2 wherein:
the operating characteristic comprises a measured voltage of a storage node of the static storage element during the powering in the first low power mode.

8. The method of claim 1 wherein the determining a time interval includes determining further based upon a process characteristic of the device.

9. The method of claim 8 wherein a process characteristic includes one of a group consisting of a threshold voltage of a transistor of the device and a saturation current of a transistor of a device.

10. The method of claim 1 wherein the operating status includes an operating state of the device.

11. The method of claim 1 wherein the operating status includes an operating condition external to the device.

12. The method of claim 11 wherein the operating condition external to the device includes a communications protocol state of a system implementing the device.

13. The method of claim 1 wherein the operating status includes an estimate of time when the device is returning to an active mode.

14. The method of claim 1 wherein the operating status that the time interval is based upon is measured leakage current of a reference circuit.

15. The method of claim 1 wherein:
the powering the device in the active mode comprises supplying power at a first voltage level;
the powering the device in the first low power mode comprises powering the device at a second voltage level, the second voltage level being a lower voltage level than the first voltage level; and
the powering the device in the second low power mode comprises powering, for at least a portion of the powering the device in the second low power mode, the device at or below a third voltage level, the third voltage level being lower than the second voltage level.

16. The method of claim 1 wherein powering the device in the second low power mode comprises powering the device during first type phases at or below a first voltage level, and powering the device during second type phases at a higher voltage level than the first voltage level.

17. The method of claim 1 wherein the determining a time interval during an operation of the device occurs during the powering the device in the first low power mode.

18. The method of claim 1 wherein the device includes a static storage element, wherein the powering the device comprises powering the static storage element.

19. The method of claim 18 wherein the static storage element includes a static RAM memory cell, where the powering the device comprises powering the static RAM memory cell.

20. A method for powering a static storage element device comprising:
powering the static storage element device in an active mode;
powering the static storage element device in a first low power mode;
determining a value for a time interval during an operation of the static storage element device based upon at least one characteristic of the static storage element; and
transitioning from powering the static storage element device in the first low power mode to powering the static storage element device in a second low power mode if the powering the static storage element device in the first low power mode comprises powering the static storage element device in the first low power mode for a greater amount of time than the time interval;
wherein powering the static storage element device in the second low power mode comprises powering the static storage element device during alternating first type phases and second type phases in the second low power mode, wherein the powering the static storage element device during the first type phases in the second low power mode comprises powering the static storage element device at or below a first voltage level, wherein powering the static storage element device during the second type phases in the second low power mode comprises powering the static storage element device at a higher voltage level than the first voltage level.

21. A system comprising:
a static storage element device coupled to a first power rail and a second power rail; and
a voltage mode control circuit coupled to the static storage element device, the voltage mode control circuit comprising an input to receive an operating mode signal indicative of a desired operating mode of the static storage element device, the voltage mode control circuit controlling a voltage differential across the first power rail and the second power rail such that in an active mode, the voltage differential is at a first voltage level, in a first low power mode having a first RMS voltage, the voltage differential is at a second voltage level lower than the first voltage level, and in a second low power mode having a second RMS voltage, the voltage differential is at a third voltage level for at least some portion of the second low power mode, wherein the third voltage level is less than the second voltage level, wherein the voltage mode control circuit is configured to transition from powering the static storage element device in the first low power mode to powering the static storage element device in the second low power mode if the powering the static storage element device in the first low power mode comprises powering the static storage element device in the first low power mode for a greater amount of time than a time interval, the voltage mode control circuit comprising a first input for receiving an indication of an operating status, the time interval being based upon the operating status.

* * * * *